(12) United States Patent  
Cui et al.

(10) Patent No.: US 12,414,393 B2  
(45) Date of Patent: Sep. 9, 2025

(54) MICRO SPECTRUM CHIP BASED ON UNITS OF DIFFERENT SHAPES

(71) Applicant: Tsinghua University, Beijing (CN)

(72) Inventors: Kaiyu Cui, Beijing (CN); Jiawei Yang, Beijing (CN); Yidong Huang, Beijing (CN); Wei Zhang, Beijing (CN); Xue Feng, Beijing (CN); Fang Liu, Beijing (CN)

(73) Assignee: Tsinghua University, Beijing (CN)

( * ) Notice: Subject to any disclaimer, the term of this patent is extended or adjusted under 35 U.S.C. 154(b) by 784 days.

(21) Appl. No.: 17/423,414

(22) PCT Filed: Oct. 12, 2020

(86) PCT No.: PCT/CN2020/120409  
§ 371 (c)(1),  
(2) Date: Jul. 15, 2021

(87) PCT Pub. No.: WO2022/032843  
PCT Pub. Date: Feb. 17, 2022

(65) Prior Publication Data  
US 2022/0344381 A1    Oct. 27, 2022

(30) Foreign Application Priority Data  
Aug. 14, 2020 (CN) .......................... 202010821286.5

(51) Int. Cl.  
*H01L 27/146* (2006.01)  
*H10F 39/00* (2025.01)

(52) U.S. Cl.  
CPC ......... *H10F 39/805* (2025.01); *H10F 39/024* (2025.01)

(58) Field of Classification Search  
CPC ........... H01L 27/1462; H01L 27/14685; H01L 27/14625; H01L 27/14689;  
(Continued)

(56) References Cited

U.S. PATENT DOCUMENTS

2007/0298533 A1    12/2007    Yang  
2012/0327398 A1    12/2012    Chakravarty  
(Continued)

FOREIGN PATENT DOCUMENTS

CN        101858786 A    10/2010  
CN        106847849 A    6/2017  
(Continued)

OTHER PUBLICATIONS

First Office Action dated Feb. 15, 2023 corresponding to Chinese Application No. 202010821286.5, 4 pages.  
(Continued)

*Primary Examiner* — Cuong B Nguyen  
(74) *Attorney, Agent, or Firm* — Dickinson Wright PLLC; Michael E. Noe

(57) ABSTRACT

A micro spectrum chip based on units of different shapes. The micro spectrum chip includes a CIS wafer and an optical modulation layer. The optical modulation layer includes several micro-nano structure units arranged on the surface of a photosensitive area of the CIS wafer. Each micro-nano structure unit includes a plurality of micro-nano structure arrays, and in each micro-nano structure unit, different micro-nano structure arrays are two-dimensional gratings composed of internal units of different shapes. In each micro-nano structure unit in this scheme, different micro-nano structure arrays have different shapes of internal units, and each group of micro-nano structure arrays have different modulation effects on lights with different wavelengths. The degree of freedom of "shape" is fully utilized to obtain a rich modulation effect on the incident light. A two-dimensional grating structure based on internal units of different shapes is utilized.

14 Claims, 12 Drawing Sheets

(58) Field of Classification Search
CPC . H01L 27/14643–14663; H01L 27/14–14893; H01L 31/1013; H01L 31/1016; H01L 31/145–153; H01L 31/165–173; H01L 31/02005; H01L 31/02024–0203; H01L 31/02162–02165; H01L 31/02332; H01L 31/02327; H01L 31/02325; G02B 26/00; G02B 6/00; H10F 39/805; H10F 39/024; H10F 39/806; Y02P 70/50; H10K 50/85–865

See application file for complete search history.

(56) References Cited

U.S. PATENT DOCUMENTS

| | | | |
|---|---|---|---|
| 2014/0049812 A1* | 2/2014 | Palanchoke | G02B 5/208 359/360 |
| 2020/0133013 A1* | 4/2020 | Sales | G02B 5/0215 |
| 2021/0144326 A1* | 5/2021 | Sato | H04N 25/63 |
| 2021/0183935 A1* | 6/2021 | Chen | H01L 27/14625 |
| 2022/0190016 A1* | 6/2022 | Dupoiron | H04N 25/17 |

FOREIGN PATENT DOCUMENTS

| | | |
|---|---|---|
| CN | 107894625 A | 4/2018 |
| CN | 110346313 A | 10/2019 |
| CN | 110381243 A | 10/2019 |
| CN | 211122509 | 7/2020 |
| CN | 111490060 A | 8/2020 |
| CN | 111505820 A | 8/2020 |
| CN | 211627935 | 10/2020 |
| CN | 112018139 A | 12/2020 |
| CN | 112018140 A | 12/2020 |
| CN | 112018141 A | 12/2020 |
| TW | 202024725 A | 7/2020 |

OTHER PUBLICATIONS

International Search Report dated May 7, 2021 corresponding to International Application No. PCT/CN2020/120409 with translation, 15 pages.

Second Office Action dated Aug. 4, 2023 corresponding to Chinese Application No. 202010821286.5, 4 pages.

* cited by examiner

MICRO SPECTRUM CHIP BASED ON UNITS OF DIFFERENT SHAPES

CROSS-REFERENCE TO RELATED APPLICATIONS

The present application claims priority to Chinese Patent Application No. 202010821286.5 filed on Aug. 14, 2020, entitled "Micro Spectrum Chip Based on Units of Different Shapes," the disclosure of which is hereby incorporated by reference in its entirety.

FIELD OF TECHNOLOGY

The present application relates to the technical field of spectral imaging, in particular to a micro spectrum chip based on units of different shapes.

BACKGROUND

For traditional spectrometers, it is necessary to spatially separate incident light of different wavelengths through a beam-splitting element and then perform the detection. However, the precise beam-splitting element is usually large in size, which limits the miniaturization of the spectrometer. In addition, the incident light is modulated by a micro-nano structure array with units of regular, repeating shapes, and the spectrum information of the incident light may be restored from the responses of the detectors with the aid of algorithms. However, in this solution, the broad-spectrum modulation functions that may be achieved using the regular-shape units and by changing the period, duty cycle and other parameters are limited, so that not only does it limit the precision of spectrum restoration, but it is also difficult to further reduce the size of the device. Therefore, it is of great significance to provide a spectrum chip with higher precision and smaller size.

SUMMARY

Embodiments of the present application provide a micro spectrum chip based on units of different shapes, so as to solve the problems including limited precision of spectrum restoration and difficulties in further reducing the size of the device due to the limited broad-spectrum modulation function achievable by the existing spectral chip, thereby providing spectroscopy chip with higher precision and smaller size.

An embodiment of the present application provides a micro spectrum chip based on units of different shapes, including a CIS wafer and an optical modulation layer; the optical modulation layer includes several micro-nano structure units arranged on the surface of a photosensitive area of the CIS wafer, each micro-nano structure unit includes a plurality of micro-nano structure arrays, and in each micro-nano structure unit, different micro-nano structure arrays are two-dimensional gratings including internal units of different shapes.

In the micro spectrum chip based on units of different shapes according to an embodiment of the present application, the several micro-nano structure units are identical repeating units, the micro-nano structure arrays located at corresponding positions in different micro-nano structure units are identical, and/or, no micro-nano structure array exists in at least one corresponding position in different micro-nano structure units, and/or, each of the micro-nano structure units has a size of 0.5 µm2 to 40000 µm2, and/or, each of the micro-nano structure arrays has a period of 20 nm to 50 µm.

In the micro spectrum chip based on units of different shapes according to an embodiment of the present application, the number of micro-nano structure arrays contained in each of the micro-nano structure units is dynamically adjustable; and/or, the several micro-nano structure units have C4 symmetry.

In the micro spectrum chip based on units of different shapes according to an embodiment of the present application, each micro-nano structure array corresponds to one or more pixels on the CIS wafer.

In the micro spectrum chip based on units of different shapes according to an embodiment of the present application, the micro spectrum chip based on units of different shapes further includes a signal processing circuit which is connected to the CIS wafer through electrical contact.

In the micro spectrum chip based on units of different shapes according to an embodiment of the present application, the CIS wafer includes an optical detection layer and a metal wire layer, the optical detection layer is arranged under the metal wire layer, and the optical modulation layer is integrated on the metal wire layer, or, the optical detection layer is arranged above the metal wire layer, and the optical modulation layer is integrated on the optical detection layer.

In the micro spectrum chip based on units of different shapes according to an embodiment of the present application, when the optical detection layer is arranged above the metal wire layer, the optical modulation layer is prepared by etching on the optical detection layer of the CIS wafer with an etching depth of 50 nm to 2 µm.

In the micro spectrum chip based on units of different shapes according to an embodiment of the present application, the optical modulation layer has a single-layer, double-layer or multi-layer structure, and the thickness of each layer is 50 nm to 2 µm; the material of the optical modulation layer is at least one of silicon, germanium, silicon-germanium material, silicon compound, germanium compound, metal, or III-V group material, wherein the silicon compound comprises at least one of silicon nitride, silicon dioxide, and silicon carbide, and/or, when the optical modulation layer has double or multiple layers, at least one of the layers does not penetrate.

In the micro spectrum chip based on units of different shapes according to an embodiment of the present application, a light-transmitting medium layer is provided between the optical modulation layer and the CIS wafer, the thickness of the light-transmitting medium layer is 50 nm to 2 µm, and the light-transmitting medium layer is made of silicon dioxide; the light-transmitting medium layer is prepared on the CIS wafer by chemical vapor deposition, sputtering or spin coating, and then the optical modulation layer is deposited and etched on the light-transmitting medium layer, or, the optical modulation layer is prepared on the light-transmitting medium layer, and then the light-transmitting medium layer and the optical modulation layer are transferred to the CIS wafer.

In the micro spectrum chip based on units of different shapes according to an embodiment of the present application, the micro spectrum chip is integrated with micro lenses and/or optical filters, and the micro lenses and/or optical filters are arranged above or below the optical modulation layer.

Regarding the micro spectrum chip based on units of different shapes provided by the embodiments of the present application, in each micro-nano structure unit, different micro-nano structure arrays have different shapes of the internal units, and each group of micro-nano structure arrays have different modulation effects on light with different wavelengths; the degree of freedom of "shape" is fully utilized to obtain a rich modulation effect on the incident light, such that the precision of spectrum restoration is improved and the size of each unit may be reduced; a two-dimensional grating structure based on internal units of different shapes is utilized, so as to bring rich broad-spectrum modulation characteristics to incident light and achieve high-precision measurement of incident light spectrum.

BRIEF DESCRIPTION OF THE DRAWINGS

In order to more clearly illustrate technical solutions disclosed in certain embodiments of the present application, the drawings aiding in the descriptions of the embodiments are briefly described below. Obviously, the drawings in the following description only show certain embodiments of the present application, and other drawings can be obtained according to the drawings without any creative work for those skilled in the art.

DETAILED DESCRIPTION

In order to illustrate the objectives, technical solutions and advantages of the embodiments of present application more clearly, the technical solutions in the embodiments of the present application will be described clearly and completely in conjunction with the accompanying drawings in the embodiments of the present application. Obviously, the described embodiments are part of the embodiments of the present application, rather than all of the embodiments. All other embodiments obtained by a person of ordinary skill in the art based on the embodiments of the present application without any creative effort fall within the protection scope of the present application.

A micro spectrum chip based on units of different shapes according to an embodiment of the present application will be described as follows with reference to FIG. 1. The micro spectrum chip includes a CIS wafer 2 and an optical modulation layer 1; the optical modulation layer 1 includes several micro-nano structure units arranged on a surface of a photosensitive area of the CIS wafer 2, each micro-nano structure unit includes a plurality of micro-nano structure arrays, and in each micro-nano structure unit, different micro-nano structure arrays are two-dimensional gratings including internal units of different shapes.

Figure 1:
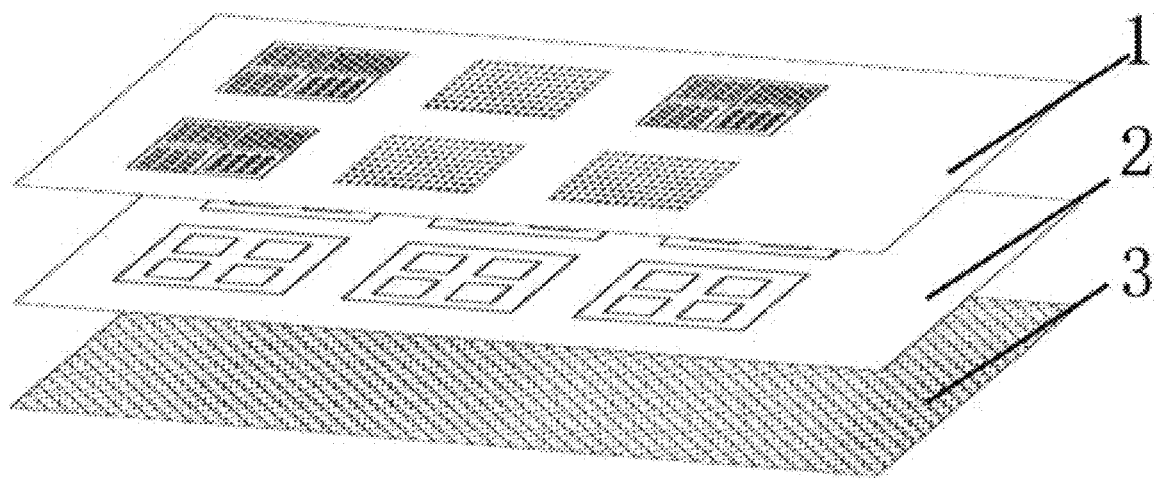
FIG. 1 is a schematic diagram showing a lateral structure of a micro spectrum chip based on units of different shapes according to an exemplary embodiment of the present application.

FIG. 1 shows a structural schematic diagram of a micro spectrum chip based on units of different shapes according to the present application. As shown in FIG. 1, the micro spectrum chip includes an optical modulation layer 1, a CIS wafer 2 and a signal processing circuit 3. After passing through the optical modulation layer 1, an incident light is converted into an electrical signal through the CIS wafer 2, and then processed and output by the signal processing circuit 3. The optical modulation layer 1 contains a plurality of repeating micro-nano structure units, each of which is composed of a plurality of groups of micro-nano structure arrays and may contain more than 8 array groups, and the overall size is 0.5 μm² to 40000 μm². In each micro-nano structure unit, different micro-nano structure arrays have different shapes of internal units, and each micro-nano structure array has a period of 20 nm to 50 μm. The internal units of different shapes have different modulation effects on lights with different wavelengths, and each group of micro-nano structure array corresponds to one or more CIS wafer photosensitive pixels in the vertical direction. After passing through the optical modulation layer 1, the incident light is modulated by each group of micro-nano structure arrays in the unit. The intensity of the modulated light signal is detected by the CIS wafer 2 and converted into an electrical signal which is then processed by the signal processing circuit 3, and the spectrum information of the incident light is restored using an algorithm. The optical modulation layer 1 is arranged on the CIS wafer in a monolithic integrated manner. In this embodiment, a two-dimensional grating structure based on units of different shapes is utilized, and the degree of freedom of "shape" is fully utilized to obtain a rich modulation effect on the incident light, such that the precision of spectrum restoration is improved and the unit size may be reduced. A two-dimensional grating structure based on internal units of different shapes is utilized, so as to bring rich broad-spectrum modulation characteristics to incident light and measure incident light spectrum in a high-precision manner. The monolithic integration of the optical modulation layer based on units of different shapes and image sensors, without discrete components, is conducive to improving the stability of the device, greatly promoting the miniaturization and lightweight of imaging spectrometers, and has a broad prospect for applications on small platforms such as small satellites and UAVs. Through monolithic integration at a wafer level, the distance between the sensor and the optical modulation layer may be minimized, which is conducive to reducing the size of the units, achieving higher spectral resolution and decreasing packaging costs.

Figure 2:
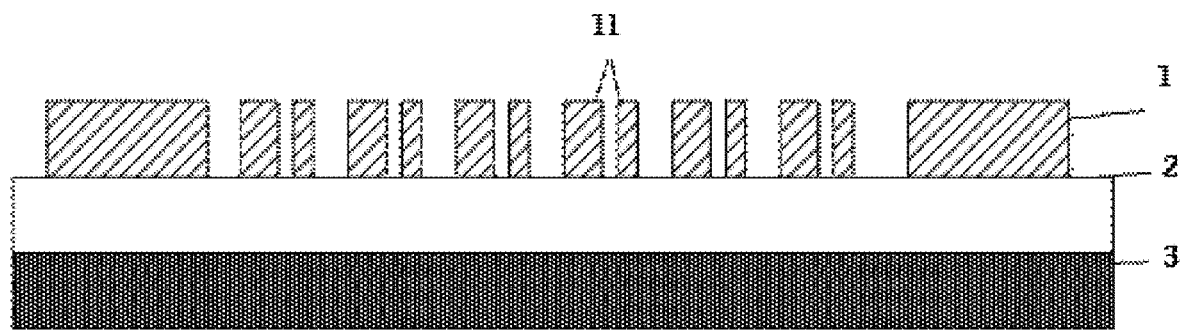
FIG. 2 is a schematic diagram showing a longitudinal structure of a micro spectrum chip based on units of different shapes according to an exemplary embodiment of the present application.

From a longitudinal perspective, as shown in FIG. 2, each group of micro-nano structure arrays in the optical modulation layer 1 is a two-dimensional grating based on different shaped internal units 11, which may be prepared by growing one or more layers of dielectric or metallic materials directly on the CIS wafer 2, followed by etching. Each group of micro-nano-structure arrays may be configured to modulate different wavelengths of light in the target range differently by changing the geometry of internal units 11. The thickness of the optical modulation layer 1 is 50 nm to 2 μm, and each group of micro-nano structure arrays in the optical modulation layer 1 corresponds to one or more pixels on the CIS wafer 2. The optical modulation layer 1 is directly prepared on the CIS wafer 2, and the CIS wafer 2 and the signal processing circuit 3 are connected through electrical contact. In this embodiment, the optical modulation layer 1 is monolithically integrated directly on the CIS wafer 2 at the wafer level, and the spectrum chip may be prepared in a single flow using CMOS process. Compared with traditional spectral imaging equipment, in this embodiment, the optical modulation layer 1 and the CIS wafer 2 based on units of different shapes are monolithically integrated without discrete components, which is beneficial to improve the stability of the device and reduce the volume and cost of the device.

The optical modulation layer 1 is etched with various micro-nano structure arrays composed of two-dimensional gratings with different shaped structures as internal units and configured to modulate the received light, and different structures have different modulation effects. From a lateral perspective, in terms of the optical modulation layer 1, the following three solutions are provided:

Solution 1

Figure 3:
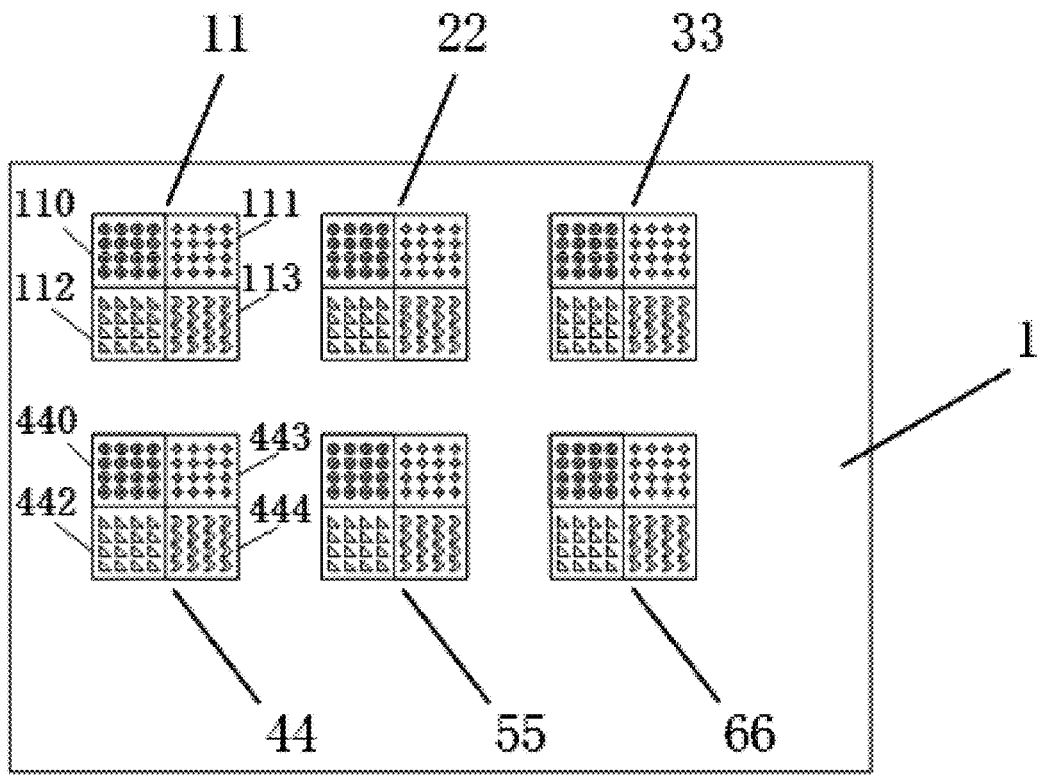
FIG. 3 is a schematic diagram showing a lateral structure of an optical modulation layer in a micro spectrum chip based on units of different shapes according to an exemplary embodiment of the present application.

As shown in FIG. 3, a plurality of repeating micro-nano structure units, such as 11, 22, 33, 44, 55, 66 exist on a plate. Each unit includes multiple groups of micro-nano structure arrays, and the micro-nano structure arrays at the same position in different units are the same. For example, the micro-nano structure array included in the internal units 11 includes a first group of two-dimensional gratings 110 having a first shape, a second group of two-dimensional gratings 111 having a second shape, a third group of two-dimensional gratings 112 having a third shape, and a fourth group of two-dimensional gratings 113 having a fourth shape; also for example, the micro-nano structure array included in the micro-nano structure unit 44 includes a first group of two-dimensional gratings 440 having a first shape, a second group of two-dimensional gratings 443 having a second shape, a third group of two-dimensional gratings having a third shape, and a fourth group of two-dimensional gratings 444 having a fourth shape. It can be seen that the shapes of the internal units 11 of different micro-nano structure arrays are different, the shapes of the internal units 11 composing the two-dimensional grating of the same micro-nano structure array are the same, and the shapes of internal units 11 are actually internal grating units composing the two-dimensional grating. Each group of micro-nano structure arrays in the micro-nano structure unit has different modulation effects on light of different wavelengths, and the modulation effects on the input light are also different between the groups of micro-nano structures. Specific modulation methods include, but are not limited to, scattering, absorption, interference, surface plasmons, resonance enhancement, and so on. By changing the shape of the unit, the corresponding transmission spectra are different after light passes through different groups of micro-nano structures. Corresponding sensors are arranged below each group of micro-nano structure arrays for detecting light intensity after light is modulated by the micro-nano structure arrays. Each unit and the light sensor underneath form a pixel point. The spectral information on each pixel point, that is, the intensity distribution of each wavelength, may be obtained through a restoration algorithm; multiple pixels form an image containing spectral information.

Solution 2

Figure 4:
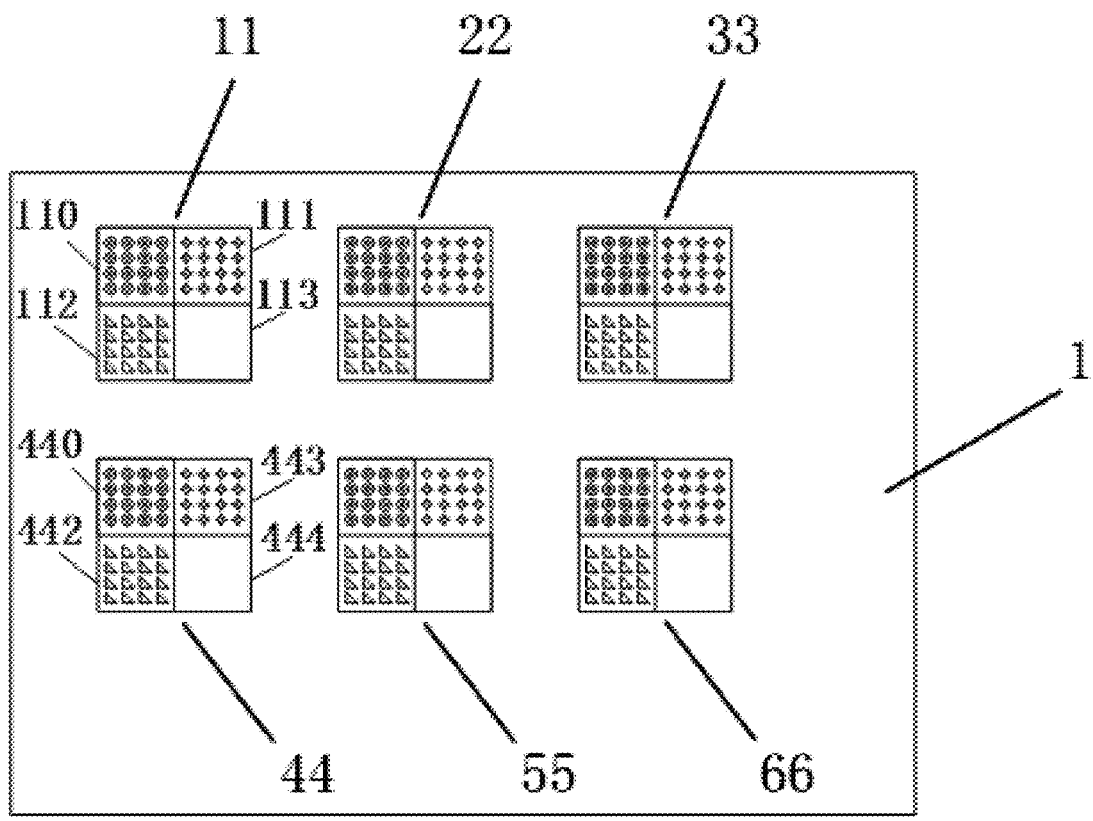
FIG. 4 is a schematic diagram showing a lateral structure of an optical modulation layer in a micro spectrum chip based on units of different shapes according to an exemplary embodiment of the present application.

As shown in FIG. 4, a plurality of repeating micro-nano structure units, such as 11, 22, 33, 44, 55, 66 exist on a plate. Each unit includes multiple groups of different micro-nano structure arrays, and the micro-nano structure arrays at the same position in different units are the same. Corresponding sensors are arranged below each group of micro-nano structure arrays. For example, the micro-nano structure array included in the internal units 11 includes a first group of gratings 110 having a first shape, a second group of gratings 111 having a second shape, and a third group of gratings 112 having a third shape, with a fourth group 113 being empty; also for example, the micro-nano structure array included in the micro-nano structure unit 44 includes a first group of gratings 440 having a first shape, a second group of gratings 443 having a second shape, and a third group of gratings 442 having a third shape, with a fourth group 444 being empty. It can be seen that the micro-nano structure array used in this solution is basically the same as that of the first solution. The difference is that there is no micro-nano structure in one of the groups where the incident light directly passes through, which may be configured to calibrate the intensity of direct light of this unit.

Solution 3

Figure 5:
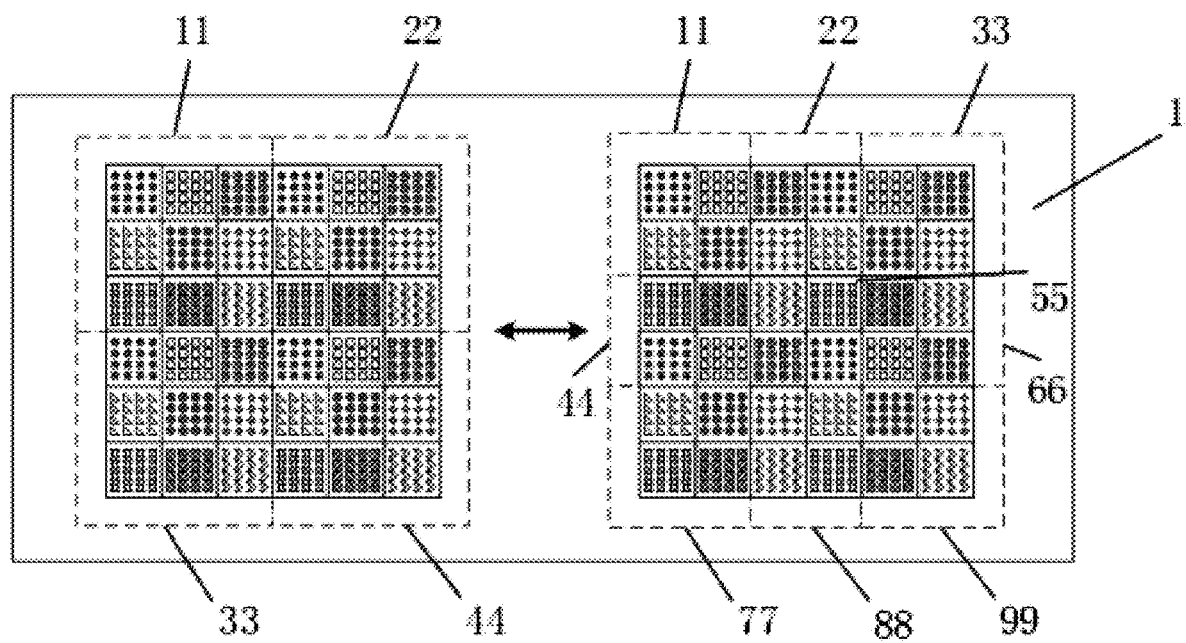
FIG. 5 is a schematic diagram showing a lateral structure of an optical modulation layer in a micro spectrum chip based on units of different shapes according to an exemplary embodiment of the present application.

As shown in FIG. 5, a plurality of repeating micro-nano structure units, such as 11, 22, 33, 44, 55, 66, 77, 88 exist on a plate. Each micro-nano structure unit includes multiple groups of different micro-nano structure arrays, and corresponding sensors are arranged below each group of micro-nano structure arrays. The difference between Solution 3 and Solution 1 is that the number of micro-nano structure arrays contained in each micro-nano structure unit is dynamically adjustable. For example, the left side of FIG. 5 shows that each unit contains nine groups of micro-nano structure arrays, and the right side thereof shows that each micro-nano structure unit contains four groups of micro-nano structure arrays. The more arrays each micro-nano structure unit contains, the higher the precision of spectrum restoration is and the better the anti-noise performance is, but the lower the spectral pixel density is. A balance between the precision of spectrum restoration and spectral pixel density may be achieved through this dynamic combination scheme.

Depending on the requirements, two alternative solutions are available for the specific structure of the CIS wafer 2:

Solution 1

Figure 6:
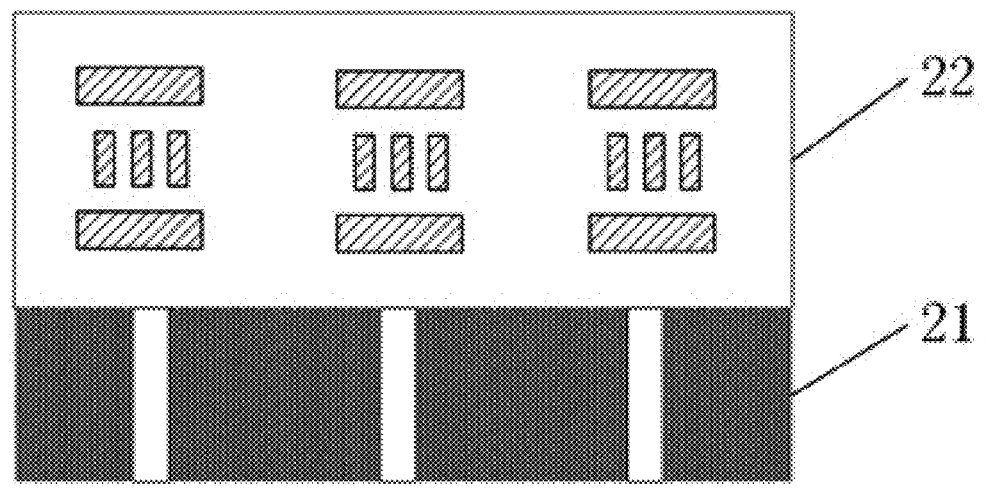
FIG. 6 is a schematic diagram showing a longitudinal structure of a front-side illuminated CIS wafer in a micro spectrum chip based on units of different shapes according to an exemplary embodiment of the present application.

As shown in FIG. 6, the CIS wafer 2 is front-side illuminated, the optical detection layer 21 is under the metal wire layer 22, the CIS wafer is not integrated with micro lenses and optical filters, and the optical modulation layer 1 is directly integrated on the metal wire layer 22.

Solution 2

Figure 7:
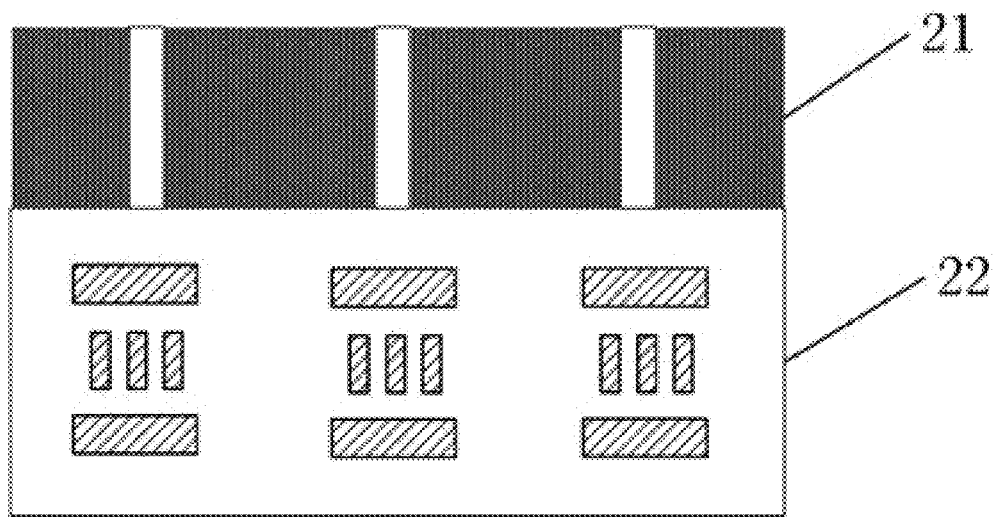
FIG. 7 is a schematic diagram showing a longitudinal structure of a back-side illuminated CIS wafer in a micro spectrum chip based on units of different shapes according to an exemplary embodiment of the present application.

As shown in FIG. 7, the CIS wafer 2 is back-side illuminated, the optical detection layer 21 is above the metal wire layer 22, the CIS wafer is not integrated with micro lenses and optical filters, and the optical modulation layer 1 is directly integrated on the optical detection layer 21.

From a longitudinal perspective, the optical modulation layer 1 may be composed of one or more layers of materials to increase the spectral modulation capability and sampling capability of the optical modulation layer 1 for incident light, which is beneficial to improve the precision of spectrum restoration. According to the longitudinal direction, the optical modulation layer 1 may have the following four solutions. Regarding the longitudinal direction, the following four solutions of the optical modulation layer 1 are provided:

Solution 1

Figure 8:
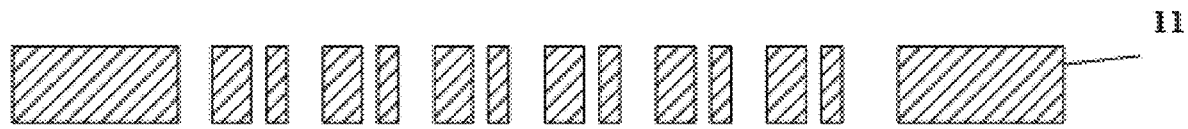
FIG. 8 is a schematic diagram showing a longitudinal structure of a single-layer grating as an optical modulation layer in a micro spectrum chip based on units of different shapes according to an exemplary embodiment of the present application.

As shown in FIG. 8, the optical modulation layer 1 is a single-layer grating structure of a single material, the grating units are of different shapes and structures, having a thickness of 50 nm to 2 μm. Specific materials may include silicon, germanium, silicon-germanium materials, silicon compounds, germanium compounds, metals, III-V group materials, etc., wherein the silicon compounds include but are not limited to silicon nitride, silicon dioxide, silicon carbide.

Solution 2

Figure 9:
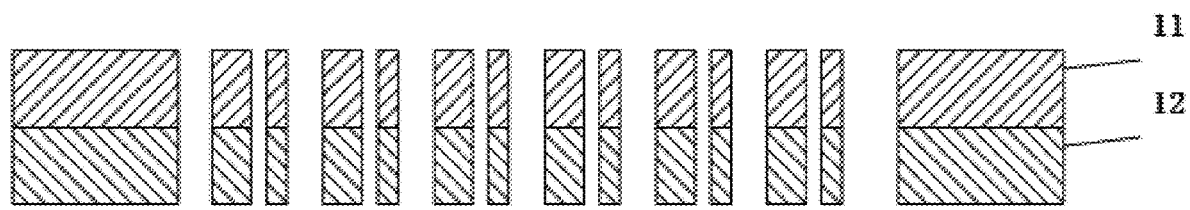
FIG. 9 is a schematic diagram showing a longitudinal structure of a double-layer grating as an optical modulation layer in a micro spectrum chip based on units of different shapes according to an exemplary embodiment of the present application.
Figure 10:
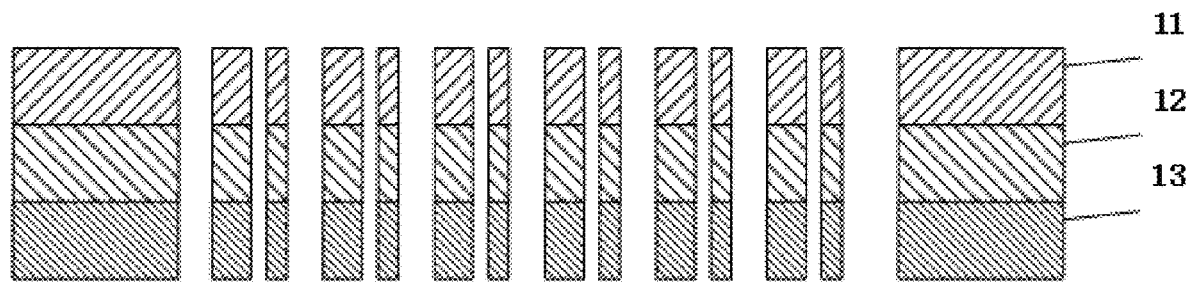
FIG. 10 is a schematic diagram showing a longitudinal structure of a multi-layer grating as an optical modulation layer in a micro spectrum chip based on units of different shapes according to an exemplary embodiment of the present application.

As shown in FIGS. 9 and 10, the optical modulation layer 1 may be composed of two or more layers of materials, wherein all the layers 11, 12, and 13 are made of different materials, and the thickness of each layer is 50 nm to 2 μm. Specific materials may include silicon, germanium, silicon-germanium materials, silicon compounds, germanium compounds, metals, III-V group materials, etc., wherein the silicon compounds include but are not limited to silicon nitride, silicon dioxide, silicon carbide.

Solution 3

Figure 11:
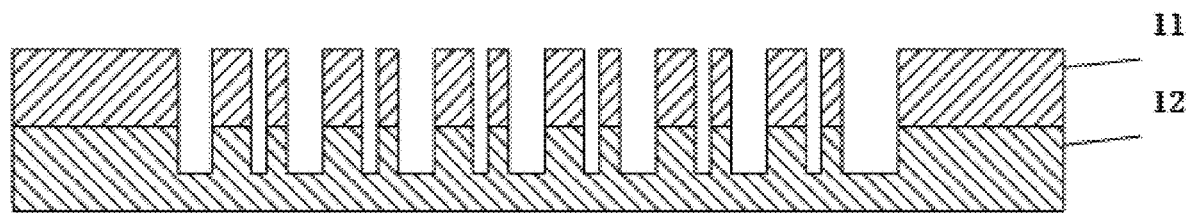
FIG. 11 is a schematic diagram showing a longitudinal structure of a multi-layer grating as an optical modulation layer while one of the layers does not penetrate in a micro spectrum chip based on units of different shapes according to an exemplary embodiment of the present application.

As shown in FIG. 11, the optical modulation layer 1 may be composed of multiple layers or mixed materials, wherein layers 11 and 12 are of different materials, and one or more layers may not penetrate through. In FIG. 11, layer 12 does not penetrate, and the thickness of each layer is 50 nm to 2 μm. Specific materials may include silicon, germanium, silicon-germanium materials, silicon compounds, germanium compounds, metals, III-V group materials, mixed sputtering materials of Si and SiN, etc., wherein the silicon compounds include but are not limited to silicon nitride, silicon dioxide, silicon carbide.

Solution 4

Figure 12:
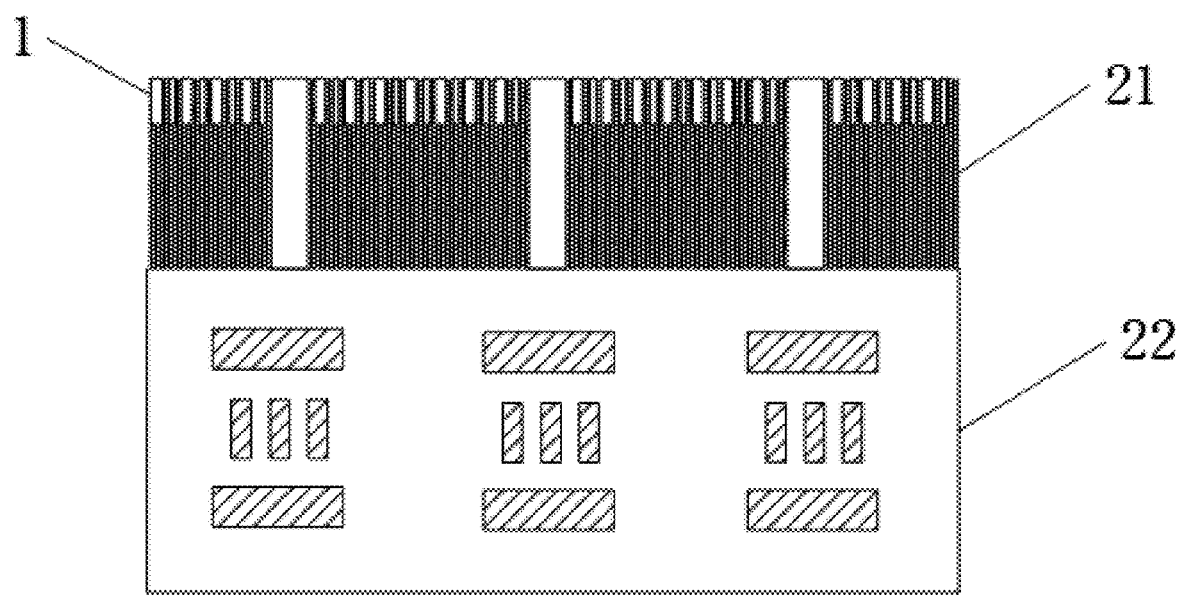
FIG. 12 is a schematic diagram showing an etching longitudinal structure of an optical modulation layer and a back-side illuminated CIS wafer in a micro spectrum chip based on units of different shapes according to an exemplary embodiment of the present application.

As shown in FIG. 12, the optical modulation layer 1 is prepared by directly etching the structure on the optical detection layer 21 of the back-side illuminated CIS wafer 2, with an etching depth of 50 nm to 2 μm.

With reference to specific embodiments, the micro spectrum chip based on units of different shapes of the present application will be further described as follows.

Embodiment 1

Figure 13:
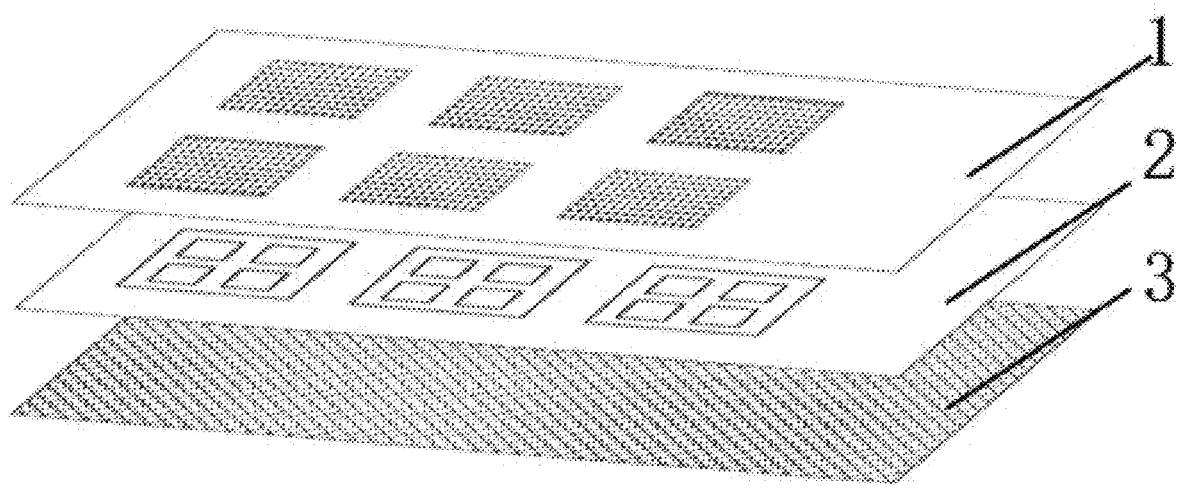
FIG. 13 is a schematic diagram showing a lateral structure of a micro spectrum chip based on units of different shapes according to an exemplary embodiment of the present application.
Figure 14:
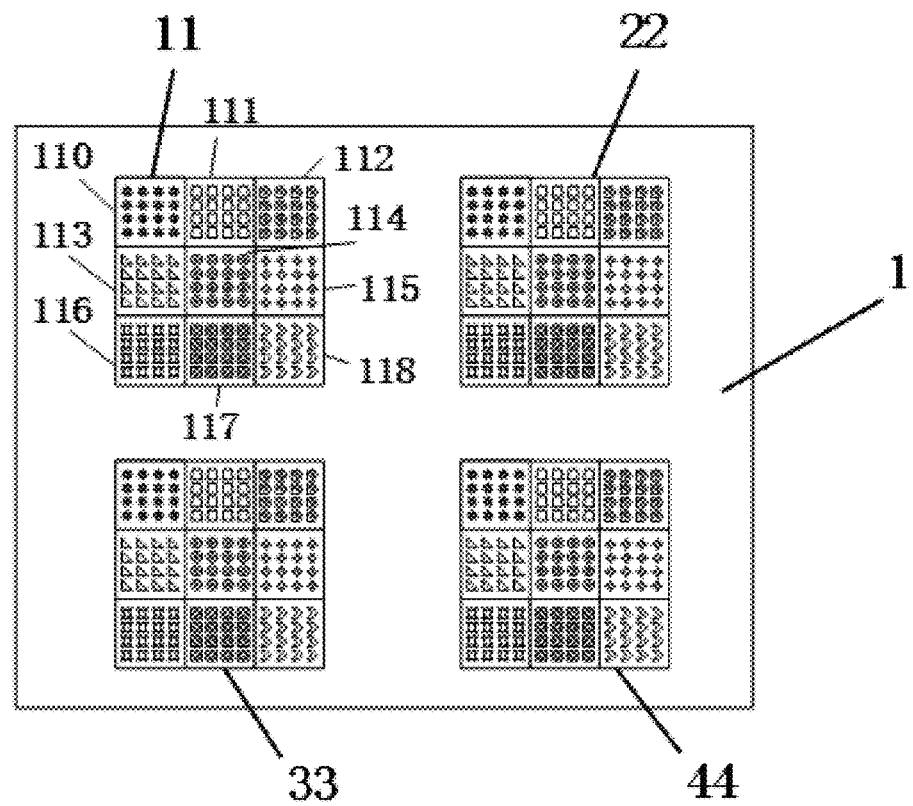
FIG. 14 is a schematic diagram showing a lateral structure of an optical modulation layer in a micro spectrum chip based on units of different shapes according to an exemplary embodiment of the present application.
Figure 15:
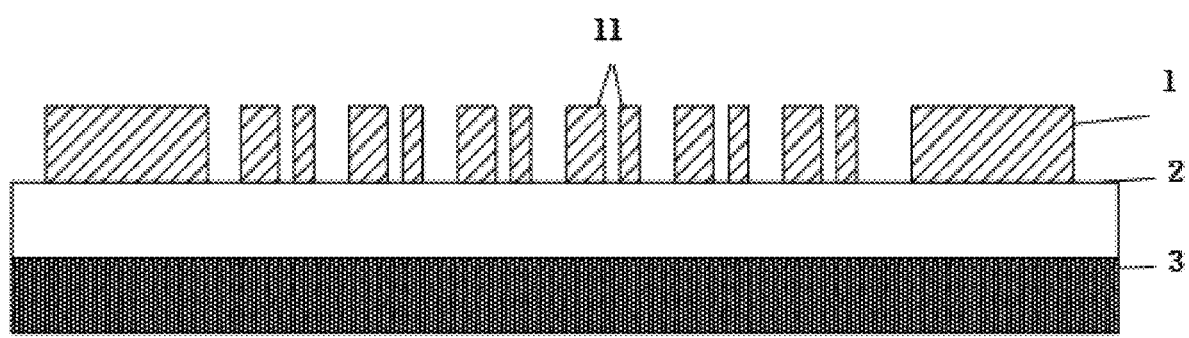
FIG. 15 is a schematic diagram showing a longitudinal structure of a micro spectrum chip based on units of different shapes according to an exemplary embodiment of the present application.

As shown in FIG. 13, the spectrum chip includes an optical modulation layer 1, a CIS wafer 2 and a signal processing circuit 3. The optical modulation layer 1 is directly prepared on the CIS wafer, its lateral structure adopts the above-mentioned Solution 1, and the specific structure is shown in FIGS. 14 and 15. The optical modulation layer 1 includes a plurality of repeating micro-nano structure units, each of which is divided into nine groups of different micro-nano structure arrays 110 to 118. Each group of micro-nano structure arrays is based on gratings with different shape units, the shape of the grating may be a regular shape such as circle, ring, polygon, cross or some other preset irregular shapes, and each group of micro-nano structure arrays has a period of 20 nm to 50 μm; each group of micro-nano structure arrays has different broad-spectrum modulation effects on incident light, the micro-nano structure arrays of different micro-nano structure units at corresponding positions are the same, and the overall size of each unit is 0.5 μm$^2$ to 40,000 μm$^2$. The dielectric material in the optical modulation layer 1 is polysilicon, and the thickness is 50 nm to 2 μm.

The above-mentioned irregular shape may be a random shape generated by an algorithm which proceeds as follows: firstly, uniformly meshing the area within a period, the size of the mesh being flexibly set. Secondly, assigning the refractive index to each mesh point on the mesh according to a certain distribution rule, usually the standard normal distribution being selected for distribution; it should be emphasized that the refractive index assigned here is only a numerical value which does not represent the refractive index of the real material. Thirdly, performing image filtering and smoothing processing and binarization processing on the refractive index distribution, at which time only two values of 0 and 1 representing air and medium, respectively are obtained in the refractive index distribution. In order to eliminate undersized parts of the structure for process preparation, a blurring process is also required, as well as a binarization process, in which the values 0 and 1 in the final generated image indicate the regions of air and medium, respectively, and undersized structures for process processing will not be contained, being convenient for processing. In addition, specific restrictions may be made on the generated random structures; for example, if the structure is required to have a certain symmetry, the refractive index distribution may be symmetrized using the algorithm; moreover, by modifying the parameters in the algorithm, the characteristics such as the minimum feature size of the generated random shape may be adjusted.

Figure 29:
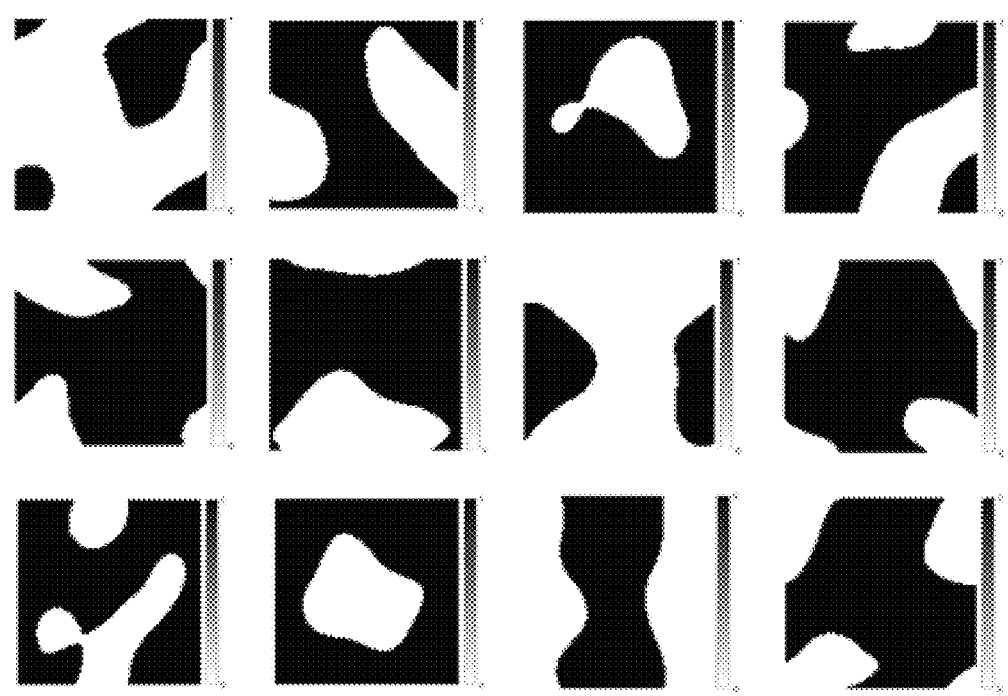
FIG. 29 is a schematic diagram showing randomly generated irregular shapes in a micro spectrum chip based on units of different shapes according to an exemplary embodiment of the present application.

Some random shapes generated by this algorithm are shown in FIG. 29, where the numbers 0 and 1 indicate the regions of air and medium, respectively. It can be seen that through this algorithm, a large number of different irregular shapes may be generated, which may have rich modulation effects on the incident light, being beneficial to improve the precision of spectral restoration.

The specific structure of the CIS wafer 2 is shown in FIG. 6, wherein the CIS wafer 2 comprise an optical detection layer 21 (e.g., a silicon detector layer) and a metal wire layer 22, and the response range is the visible near-infrared band; the CIS wafer 2 is bare, and the Bayer optical filter array and micro lens array are not prepared thereon. Each group of micro-nano structures corresponds to one or more light sensor units on the CIS wafer 2.

Figure 16:
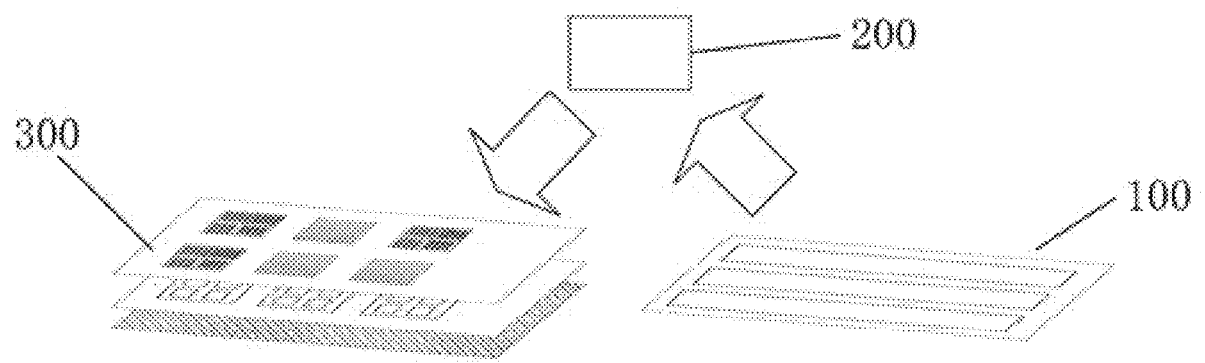
FIG. 16 is a schematic diagram of a process for multi-spectral image acquisition according to an exemplary embodiment of the present application.

The complete process of multi-spectral image acquisition is as follows: as shown in FIG. 16, the broad-spectrum light source 100 irradiates the target object 200, and then the reflected light is collected by the spectrum chip 300, or the light directly radiated from the target object is collected by the spectrum chip 300. Each micro-nano structure array and the light sensor underneath form a pixel point. The spectral information on each pixel point may be obtained through the restoration algorithm, and multiple pixels form an image containing spectral information. Both the optical modulation layer 1 and the CIS wafer 2 may be manufactured by the semiconductor CMOS integration process, and monolithic integration is achieved at the wafer level, which is beneficial to reduce the distance between the sensor and the optical modulation layer, reduce the volume of the device, as well as achieve higher spectral resolution and decrease packaging costs.

Embodiment 2

Figure 17:
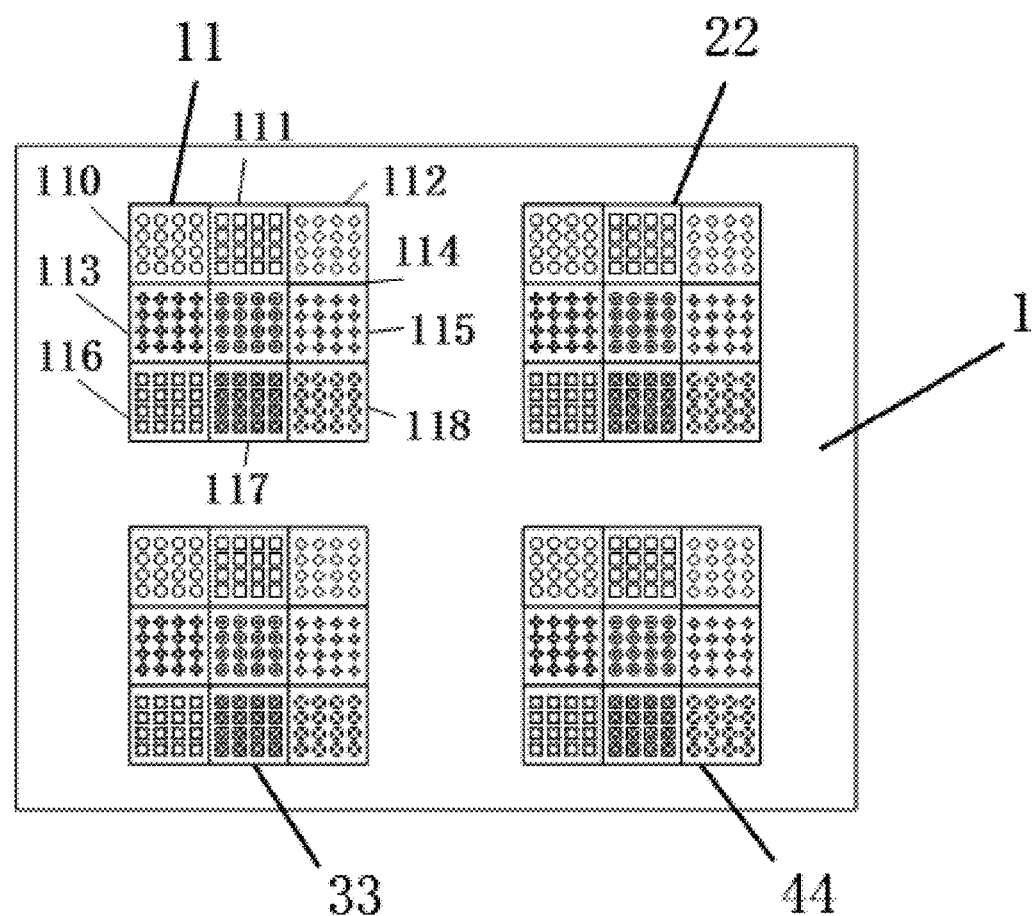
FIG. 17 is a schematic diagram showing a lateral structure of an optical modulation layer in a micro spectrum chip based on units of different shapes according to an exemplary embodiment of the present application.

As shown in FIG. 17, the main difference between Embodiment 2 and Embodiment 1 lies in the lateral structure. Several micro-nano structural units constituting the optical modulation layer 1 have C4 symmetry, that is, after the structure is rotated by 90°, 180° or 270°, it overlaps with the original structure without rotation, which allows the structure to have polarization-independent properties.

Embodiment 3

Figure 18:
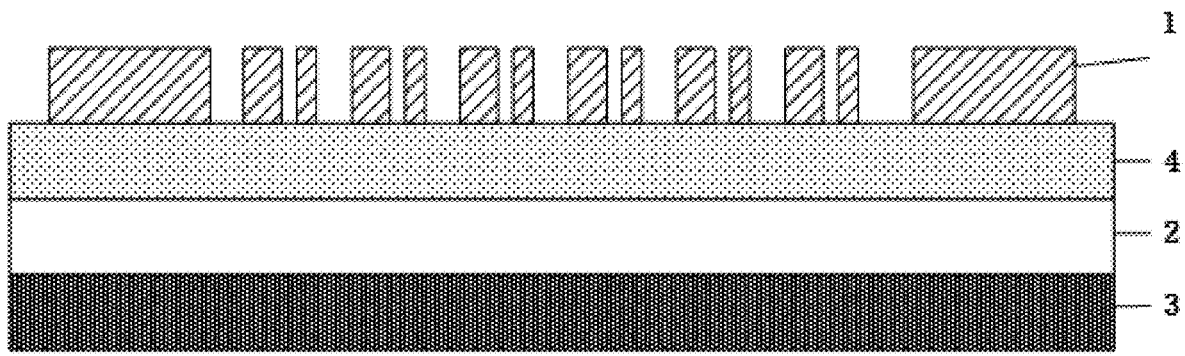
FIG. 18 is a schematic diagram showing a longitudinal structure of a micro spectrum chip based on units of different shapes according to an exemplary embodiment of the present application.

As shown in FIG. 18, the main difference between Embodiment 3 and Embodiment 1 lies in the longitudinal structure of the miniature spectrum chip. A light-transmitting medium layer 4 is added between the optical modulation layer 1 and the CIS wafer 2. The light-transmitting medium layer 4 has a thickness of 50 nm to 2 μm, and the material may be silicon dioxide. If the process solution of direct deposition growth is applied, the light-transmitting medium layer may be prepared by chemical vapor deposition, sputtering, and spin coating on CIS wafers, followed by the deposition and etching of the optical modulation layer structure on top of it. If the process solution of transfer is applied, the micro-nano structure may be prepared on the silicon dioxide first, and then the micro-nano structure and silicon dioxide may be transferred to the CIS wafer as a whole. It is possible to prepare the spectrum chip by CMOS process in a single flow, which is beneficial to reduce the failure rate of the device, improve the yield of the device, and decrease the cost.

Embodiment 4

Figure 19:
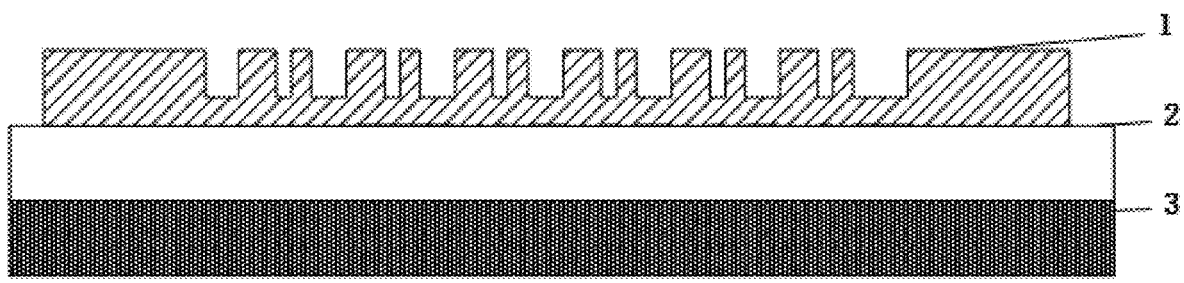
FIG. 19 is a schematic diagram showing a longitudinal structure of a micro spectrum chip based on units of different shapes according to an exemplary embodiment of the present application.

As shown in FIG. 19, the difference between Embodiment 4 and Embodiment 1 is that the grating in the optical modulation layer 1 is a partially etched structure, and the holes therein do not completely penetrate the plate, but have a certain depth. The thickness of the micro-nano structure is 50 nm to 2 μm, and the thickness of the entire plate is 100 nm to 4 μm; and a light-transmitting medium layer may be added between optical modulation layer 1 and CIS wafer 2 of this structure (not shown).

Embodiment 5

Figure 20:
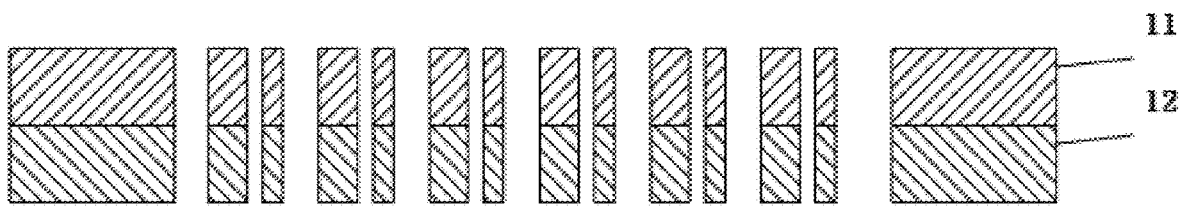
FIG. 20 is a schematic diagram showing a longitudinal structure of an optical modulation layer in a micro spectrum chip based on units of different shapes according to an exemplary embodiment of the present application.
Figure 21:
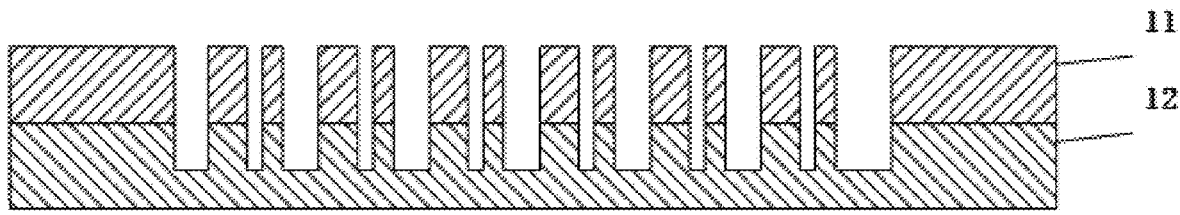
FIG. 21 is a schematic diagram showing a longitudinal structure of an optical modulation layer in a micro spectrum chip based on units of different shapes according to an exemplary embodiment of the present application.

As shown in FIG. 20, the difference between Embodiment 5 and Embodiment 1 is that the optical modulation layer 1 has a double-layer structure, layer 11 is a silicon layer, layer 12 is a silicon nitride layer, and the thickness of the double-layer structure is 50 nm to 2 μm; and, the lower layer material of this structure can also be a partially etched structure that is not penetrated, as shown in FIG. 21.

Embodiment 6

Figure 22:
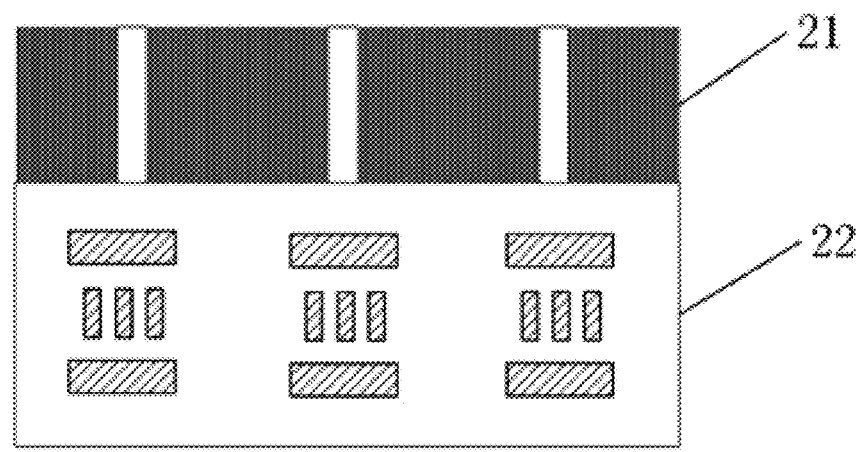
FIG. 22 is a schematic diagram showing a longitudinal structure of a CIS wafer in a micro spectrum chip based on units of different shapes according to an exemplary embodiment of the present application.

As shown in FIG. 22, the difference between Embodiment 6 and Embodiment 1 is that the CIS wafer is back-side illuminated, and the optical detection layer 21 is above the metal wire layer 22, which reduces the influence of the metal wire layer on incident light and improves the quantum efficiency of the device.

Embodiment 7

Figure 23:
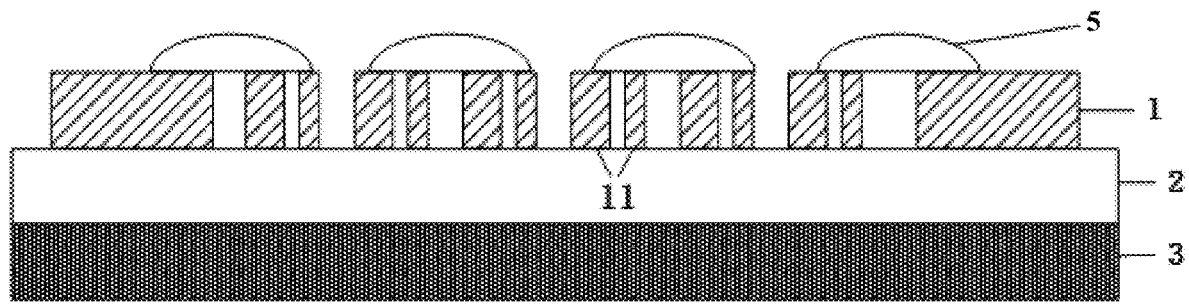
FIG. 23 is a schematic diagram showing a longitudinal structure of a micro spectrum chip based on units of different shapes according to an exemplary embodiment of the present application.
Figure 24:
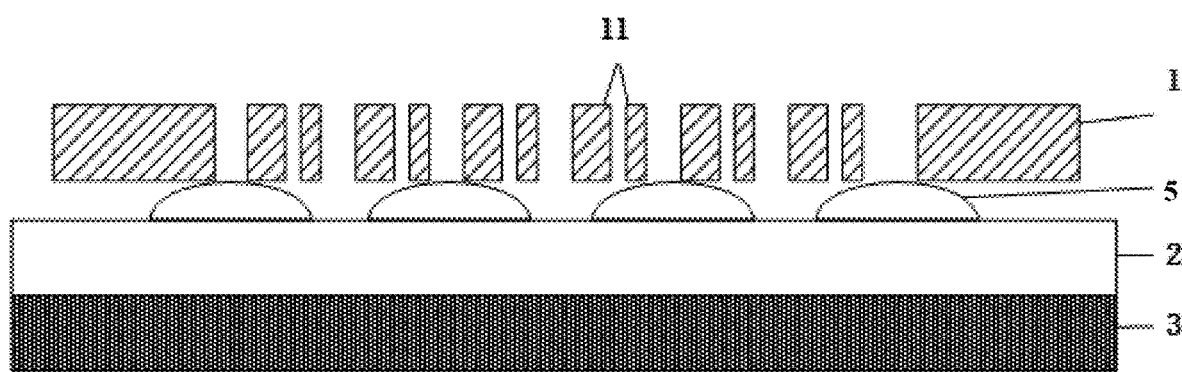
FIG. 24 is a schematic diagram showing a longitudinal structure of a micro spectrum chip based on units of different shapes according to an exemplary embodiment of the present application.
Figure 25:
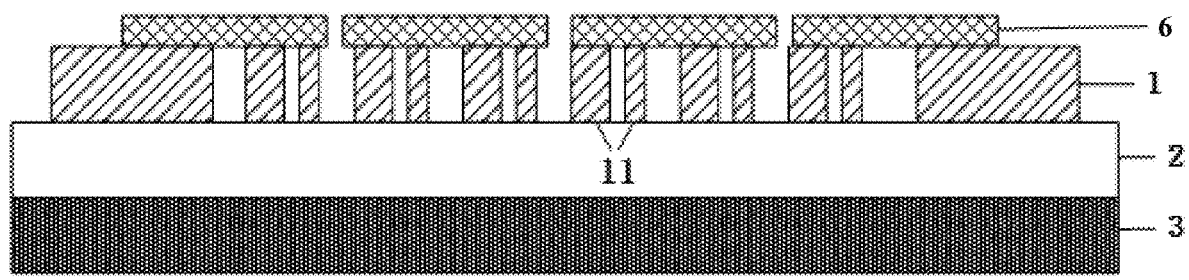
FIG. 25 is a schematic diagram showing a longitudinal structure of a micro spectrum chip based on units of different shapes according to an exemplary embodiment of the present application.
Figure 26:
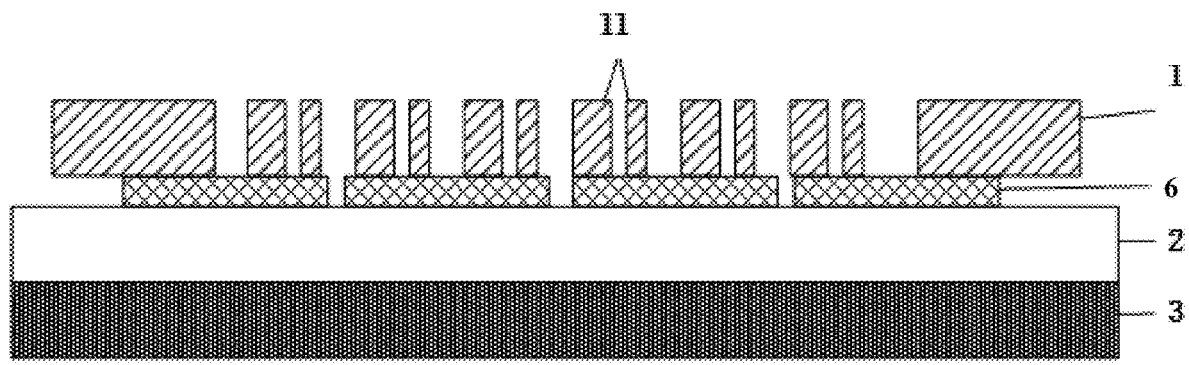
FIG. 26 is a schematic diagram showing a longitudinal structure of a micro spectrum chip based on units of different shapes according to an exemplary embodiment of the present application.
Figure 27:
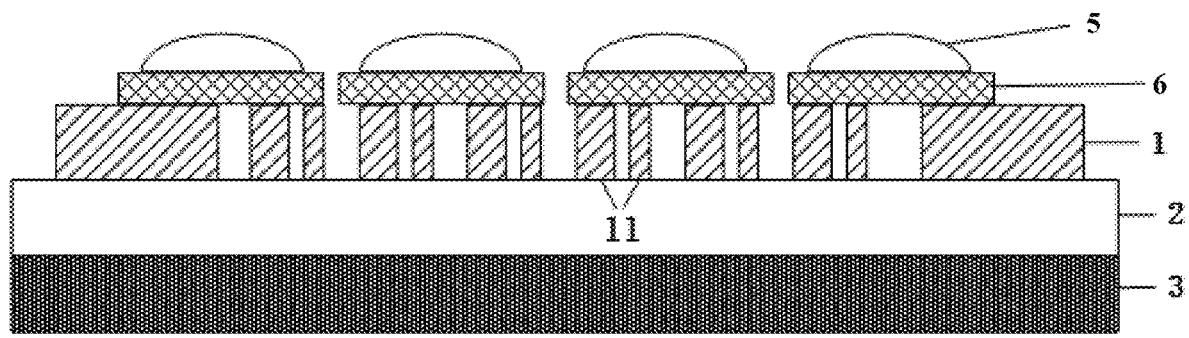
FIG. 27 is a schematic diagram showing a longitudinal structure of a micro spectrum chip based on units of different shapes according to an exemplary embodiment of the present application.
Figure 28:
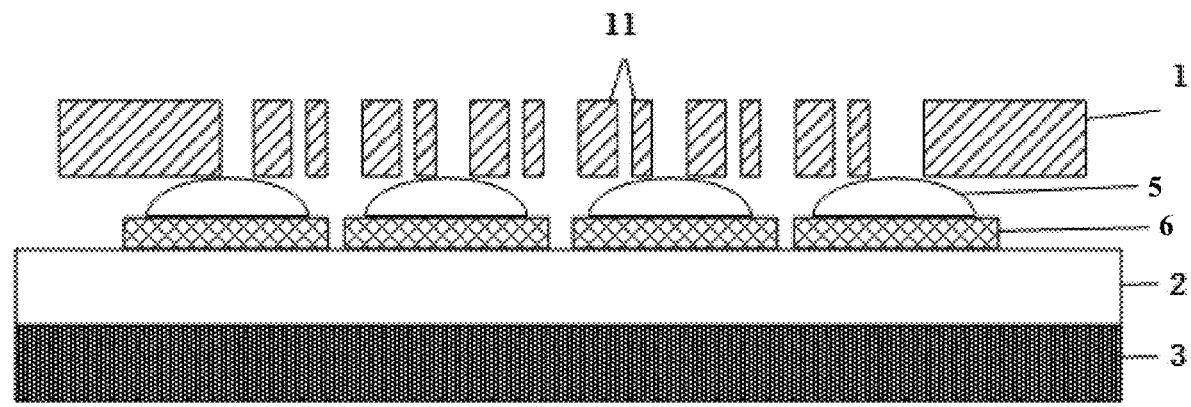
FIG. 28 is a schematic diagram showing a longitudinal structure of a micro spectrum chip based on units of different shapes according to an exemplary embodiment of the present application.

The difference between Embodiment 7 and Embodiment 1 is that the spectrum chip integrates micro lenses or optical filters or both. As shown in FIGS. 23 and 24, the spectrum chip integrates a micro lens 5, which can be disposed above (FIG. 23) or below (FIG. 24) the optical modulation layer 1; as shown in FIGS. 25 and 26, the spectrum chip integrates an optical filter 6, which may be disposed above (FIG. 25) or below (FIG. 26) the optical modulation layer 1; as shown in FIGS. 27 and 28, the spectrum chip integrates the micro lens 5 and the optical filter 6, which can be disposed above (FIG. 27) or below (FIG. 28) the optical modulation layer 1.

The above description only illustrates some embodiments of the present application and is a description of the technical principles employed. It should be understood by those skilled in the art that the scope of the disclosure covered by the present application is not limited to the technical solution formed by a particular combination of the above technical features, but should also cover other technical solutions formed by any combination of the above technical features or their equivalent features without departing from the above disclosed idea. For example, the technical solutions formed by interchanging the above features with the technical features with similar functions disclosed in the present application (but not limited to) also fall within the scope of the present application.

The embodiments above are only for exemplarily illustrating the technical solutions of the present application, and are not intended to limit the present application. Anyone skilled in the art can modify or change the above-mentioned embodiments without departing from the scope of the present application. Therefore, all equivalent modifications or changes completed by those with ordinary knowledge in the art without departing from the technical ideas disclosed in the present application should still be covered by the claims of the present application.

The invention claimed is:

1. A micro spectrum chip based on units of different shapes, comprising:
    a CMOS image sensor (CIS) wafer; and
    an optical modulation layer; the optical modulation layer comprises several micro-nano structure units arranged on a surface of a photosensitive area of the CIS wafer, wherein each micro-nano structure unit comprises a plurality of micro-nano structure arrays, and wherein in each micro-nano structure unit, different micro-nano structure arrays are two-dimensional gratings including internal units of different shapes, wherein at least one of the internal units is randomly generated,
    wherein the several micro-nano structure units are identical repeating units, the plurality of micro-nano structure arrays located at corresponding positions in different micro-nano structure units are identical, wherein no micro-nano structure array exists in at least one corresponding position in different micro-nano structure units, wherein each of the micro-nano structure units has a size of 0.5 $\mu m^2$ to 40000 $\mu m^2$, and wherein each of the plurality of micro-nano structure arrays has a period of 20 nm to 50 $\mu m$.

2. The micro spectrum chip based on units of different shapes of claim 1, wherein each micro-nano structure array corresponds to one or more pixels on the CIS wafer.

3. The micro spectrum chip based on units of different shapes of claim 1, further comprising a signal processing circuit which is connected to the CIS wafer through electrical contact.

4. The micro spectrum chip based on units of different shapes of claim 1, wherein the CIS wafer comprises an optical detection layer and a metal wire layer, wherein the optical detection layer is arranged under the metal wire layer, and wherein the optical modulation layer is integrated on the metal wire layer.

5. The micro spectrum chip based on units of different shapes of claim 1, wherein the CIS wafer comprises an optical detection layer and a metal wire layer, wherein the optical detection layer is arranged above the metal wire layer, and wherein the optical modulation layer is prepared by etching on the optical detection layer of the CIS wafer with an etching depth of 50 nm to 2 $\mu m$, and wherein the optical modulation layer is integrated on the optical detection layer.

6. The micro spectrum chip based on units of different shapes of claim 1, wherein the optical modulation layer has at least one selected from a first group consisting of single-layer, double-layer and multi-layer structure, wherein a thickness of each layer of the single-layer, double-layer or multi-layer structure is 50 nm to 2 $\mu m$; wherein a material of the optical modulation layer is at least one selected from a second group consisting of silicon, germanium, silicon-germanium material, silicon compound, germanium compound, metal, and III-V group material, wherein the silicon compound comprises at least one selected from a third group consisting of silicon nitride, silicon dioxide, and silicon carbide, and wherein when the optical modulation layer has double or multiple layers, at least one layer of the double-layer structure or at least one layer of the multi-layer structure does not penetrate.

7. The micro spectrum chip based on units of different shapes of claim 1, wherein a light-transmitting medium layer is provided between the optical modulation layer and the CIS wafer, wherein a thickness of the light-transmitting medium layer is 50 nm to 2 $\mu m$, wherein the light-transmitting medium layer is made of silicon dioxide; and wherein the light-transmitting medium layer is prepared on the CIS wafer by chemical vapor deposition, sputtering or spin coating, and then the optical modulation layer is deposited and etched on the light-transmitting medium layer.

8. The micro spectrum chip based on units of different shapes of claim 1, wherein the micro spectrum chip is integrated with micro lenses or optical filters, and wherein the micro lenses or optical filters are arranged above or below the optical modulation layer.

9. The micro spectrum chip based on units of different shapes of claim 1, further comprising a signal processing circuit which is connected to the CIS wafer through electrical contact.

10. The micro spectrum chip based on units of different shapes of claim 2, further comprising a signal processing circuit which is connected to the CIS wafer through electrical contact.

11. The micro spectrum chip based on units of different shapes of claim 1, wherein a light-transmitting medium layer is provided between the optical modulation layer and the CIS wafer, wherein the thickness of the light-transmitting medium layer is 50 nm to 2 µm, wherein the light-transmitting medium layer is made of silicon dioxide; wherein the optical modulation layer is prepared on the light-transmitting medium layer, and then the light-transmitting medium layer and the optical modulation layer are transferred to the CIS wafer.

12. The micro spectrum chip of claim 1, wherein the at least one of the internal units that is randomly generated includes a first internal unit having a first irregular shape and a second internal unit having a second irregular shape that is different from the first irregular shape.

13. A micro spectrum chip based on units of different shapes, comprising:
   a CMOS image sensor (CIS) wafer; and
   an optical modulation layer; the optical modulation layer comprises several micro-nano structure units arranged on a surface of a photosensitive area of the CIS wafer, wherein each micro-nano structure unit comprises a plurality of micro-nano structure arrays, and wherein in each micro-nano structure unit, different micro-nano structure arrays are two-dimensional gratings including internal units of different shapes, wherein at least one of the internal units is randomly generated,
   wherein a number of the plurality of micro-nano structure arrays contained in each of the micro-nano structure units is dynamically adjustable; and wherein the several micro-nano structure units have C4 symmetry.

14. The micro spectrum chip based on units of different shapes of claim 13, further comprising a signal processing circuit which is connected to the CIS wafer through electrical contact.

* * * * *